United States Patent
Lin et al.

(10) Patent No.: US 8,081,731 B2
(45) Date of Patent: Dec. 20, 2011

(54) SHIFT REGISTER

(75) Inventors: Chih-Lung Lin, Hsin-Chu (TW); Chun-Da Tu, Hsin-Chu (TW); Yung-Chih Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 47 days.

(21) Appl. No.: 12/615,247

(22) Filed: Nov. 9, 2009

(65) Prior Publication Data
US 2011/0044423 A1 Feb. 24, 2011

(30) Foreign Application Priority Data
Aug. 21, 2009 (TW) .............................. 98128189 A

(51) Int. Cl.
*G11C 19/00* (2006.01)
(52) U.S. Cl. ............................... 377/64; 377/78; 377/79
(58) Field of Classification Search ........................ None
See application file for complete search history.

(56) References Cited

U.S. PATENT DOCUMENTS

| | | | | |
|---|---|---|---|---|
| 7,342,568 | B2 * | 3/2008 | Wei et al. | 345/100 |
| 7,627,077 | B2 * | 12/2009 | Wei et al. | 377/64 |
| 7,817,770 | B2 * | 10/2010 | Chang et al. | 377/64 |
| 2003/0128180 | A1 | 7/2003 | Kim et al. | |
| 2007/0086558 | A1 * | 4/2007 | Wei et al. | 377/64 |
| 2008/0258998 | A1 | 10/2008 | Miyake | |
| 2009/0041177 | A1 | 2/2009 | Chien et al. | |
| 2009/0304138 | A1 * | 12/2009 | Tsai et al. | 377/79 |
| 2010/0150303 | A1 * | 6/2010 | Tsai et al. | 377/79 |

* cited by examiner

*Primary Examiner* — Tuan T Lam
(74) *Attorney, Agent, or Firm* — Winston Hsu; Scott Margo

(57) ABSTRACT

A shift register includes a plurality of electrically connected shift units. Each shift unit includes a pull-up circuit, a pull-up driving circuit, a pull-down circuit, and a pull-down driving circuit. The pull-up circuit outputs a first signal to an output node according to the first signal and a voltage of a driving node. The pull-up driving drives the pull-up circuit according to an output voltage of the previous shift unit. The pull-down driving circuit outputs a low level voltage to the driving node and the output node according to the first signal and a second signal. The pull-down circuit resets the pull-up driving circuit according to the voltage of the output node and outputs the low level voltage to the output node and the driving node according to a third signal and a fourth signal.

14 Claims, 5 Drawing Sheets

SHIFT REGISTER

BACKGROUND OF THE INVENTION

1. Field of the Invention

The present invention is related to a shift register, and more particularly, to a shift register which improves the ability of pulling down the voltage level of the output node of the shift register.

2. Description of the Prior Art

The gate driver of a LCD device utilizes shift register for generating sequential scan signals. Conventionally the shift register is manufactured onto the glass substrate of the LCD device by amorphous silicon thin film transistors (a-Si TFTs) and low temperature polycrystalline silicon (LTPS) TFTs processes. The shift register usually includes multistage circuits, so certain TFTs are turned on for a relative long period of time. However, when the voltage is continuously and frequently applied to the TFTs or the LTPS TFTs for a long period of time, the TFTs tend to become malfunction due to degradation, consequently the reliability of the shift register is sabotaged.

Please refer to FIG. 1. FIG. 1 is a diagram illustrating the conventional shift register. In the Nth shift register 100, the first transistor Q1 is utilized to drive the second transistor Q2. The control end and the first end of the first transistor Q1 are electrically connected to the input end of the shift register, for receiving the output signal of the previous stage SR(N−1). The second end of the first transistor Q1 is electrically connected to the control end of the second transistor Q2. The first end of the second transistor Q2 is utilized to receive the first signal CK1. The second end of the second transistor Q2 is electrically connected to the output end OUT of the shift register, for outputting the first signal CK1 to the output end OUT according to the voltage level of the driving node G. The shift register 100 includes a first pull-down module 110 and a second pull-down module 120. The third transistor Q3 and the ninth transistor Q9 are electrically connected to the output end OUT, for pulling the voltage level of the output end OUT to a low voltage level VSS after the output end OUT outputs a high level voltage. The sixth transistor Q6 and the tenth transistor Q10 are electrically connected to the driving node G, for pulling the voltage level of the driving node G to the low voltage level VSS to turn off the second transistor Q2, after the output end OUT outputs the high voltage level. The first pull-down module 110 and the second pull-down module 120 each approximately execute the pull down operation 50% of the time, according to the first signal CK1 and the second signal CK2 respectively. In the first pull-down module 110, the control ends of the ninth transistor Q9 and the tenth transistor Q10 are electrically connected to the node K. The voltage level of the node K is determined by the twelfth transistor Q12 and the thirteenth transistor Q13. In the second pull-down module 120, the control ends of the third transistor Q3 and the sixth transistor Q6 are electrically connected to the node P. The voltage level of the node P is determined by the fourth transistor Q4 and the fifth transistor Q5. The eleventh transistor Q11 is utilized to pull the voltage level of the node K to the low voltage level VSS. The seventh transistor Q7 is utilized to pull the voltage level of the node P to the low voltage level VSS when the output end OUT outputs the high voltage level. Furthermore, the eighth transistor Q8 is electrically connected to the node P, for pulling the voltage level of the node P to the low voltage level VSS when the output end OUT outputs the high voltage level.

The second signal CK2 is complementary to the first signal CK1; when the first signal CK1 is of the high voltage level and the second signal CK2 is of the low voltage level VSS, the voltage level of the node P is of the low voltage level VSS and the voltage level of the node K is of the high voltage level. However, the voltage level of the node K is pulled to the low voltage level VSS by the eleventh transistor Q11 except when the output end OUT outputs the high voltage level. Similarly, when the first signal CK1 is of the low voltage level VSS and the second signal CK2 is of the high voltage level, the voltage level of the node K is of the low voltage level VSS and the voltage level of the node P is of the high voltage level. However, the voltage level of the node P is pulled to the low voltage level VSS by the seventh transistor Q7 and the eighth transistor Q8 except when the output end OUT outputs the high voltage level.

The voltage level of the nodes K and P are maintained at the high voltage level approximately 50% of the time, and at the low voltage level VSS for the other 50% of the time. When at the high voltage level, the transistor is turned on and the threshold value of the transistor accordingly increases; when at the low voltage level, the threshold value of the transistor decreases. When the high voltage level is of an inverted value to the low voltage level, the increased magnitude of the threshold value is equivalent to the decreased magnitude of the threshold value; the net variation of the threshold value is approximately zero and the operation of the shift register is then considered as stable. However, the current conventional high voltage level is around +18V and the low voltage level VSS is around −6V. Therefore, the variation of the threshold values of the third transistor Q3, the sixth transistor Q6, the ninth transistor Q9 and the tenth transistor 10 controlled by the nodes K and P increases with time, causing the shift register to be unstable.

SUMMARY OF THE INVENTION

The present invention discloses a shift register. The shift register comprises a plurality of electrically connected shift units. Each shift unit comprises a pull-up circuit, a pull-up driving circuit, a pull-down driving circuit and a pull-down circuit. The pull-up circuit is for outputting a first signal to an output node according to the first signal and a voltage level of a driving node. The pull-up driving circuit is electrically connected to the pull-up circuit, and is for driving the pull-up circuit according to an output voltage of the previous shift unit. The pull-down driving circuit is electrically connected to the pull-up driving circuit, and is for outputting a low voltage level to the driving node and the output node, according to the first signal and a second signal. The pull-down circuit is electrically connected to the pull-up circuit and the pull-up driving circuit, and is for resetting the pull-up driving circuit according to the voltage level of the output node, and outputting the low voltage level to the driving node and the output node according to a third signal and a fourth signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
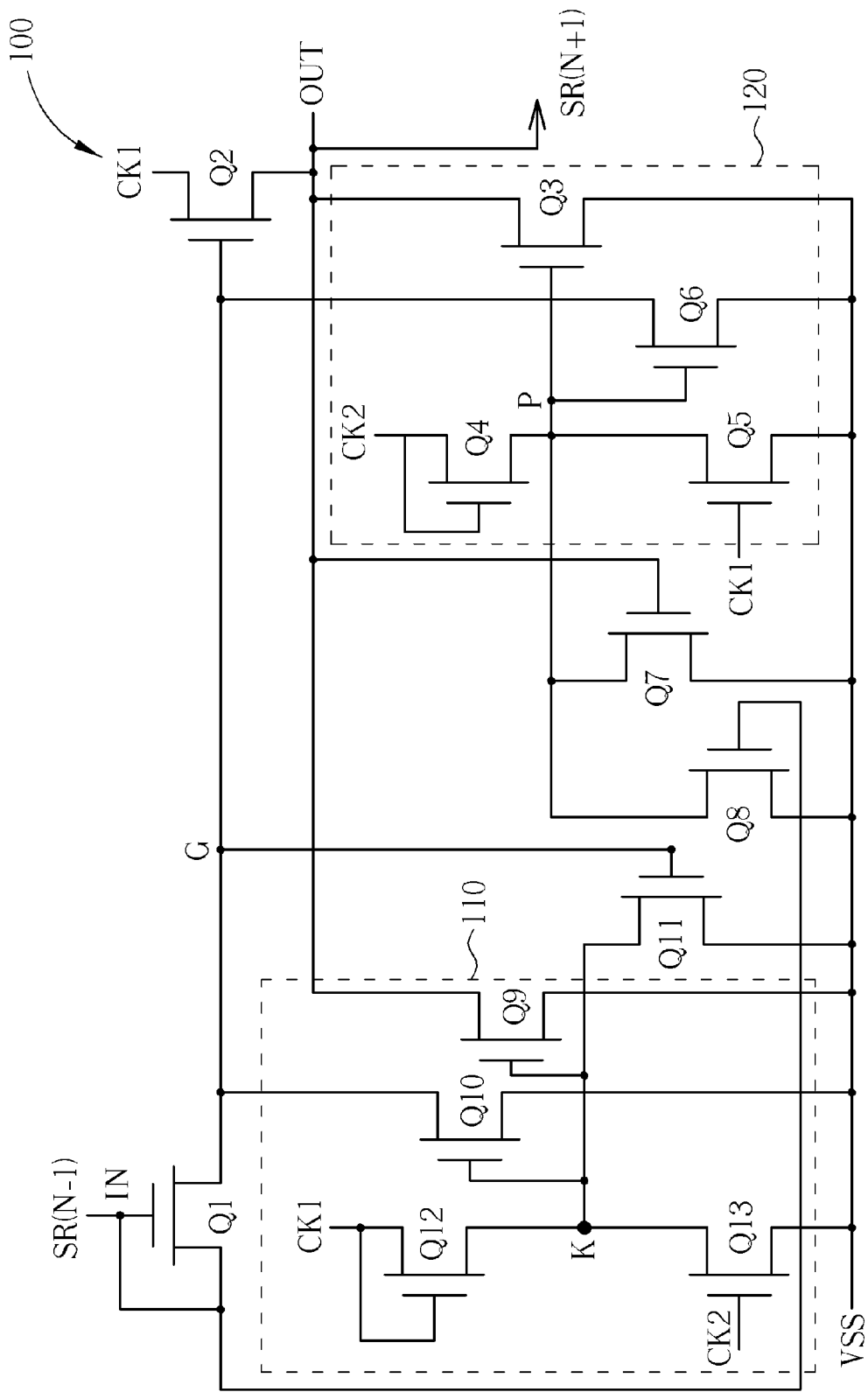
FIG. 1 is a diagram illustrating the conventional shift register.
Figure 2:
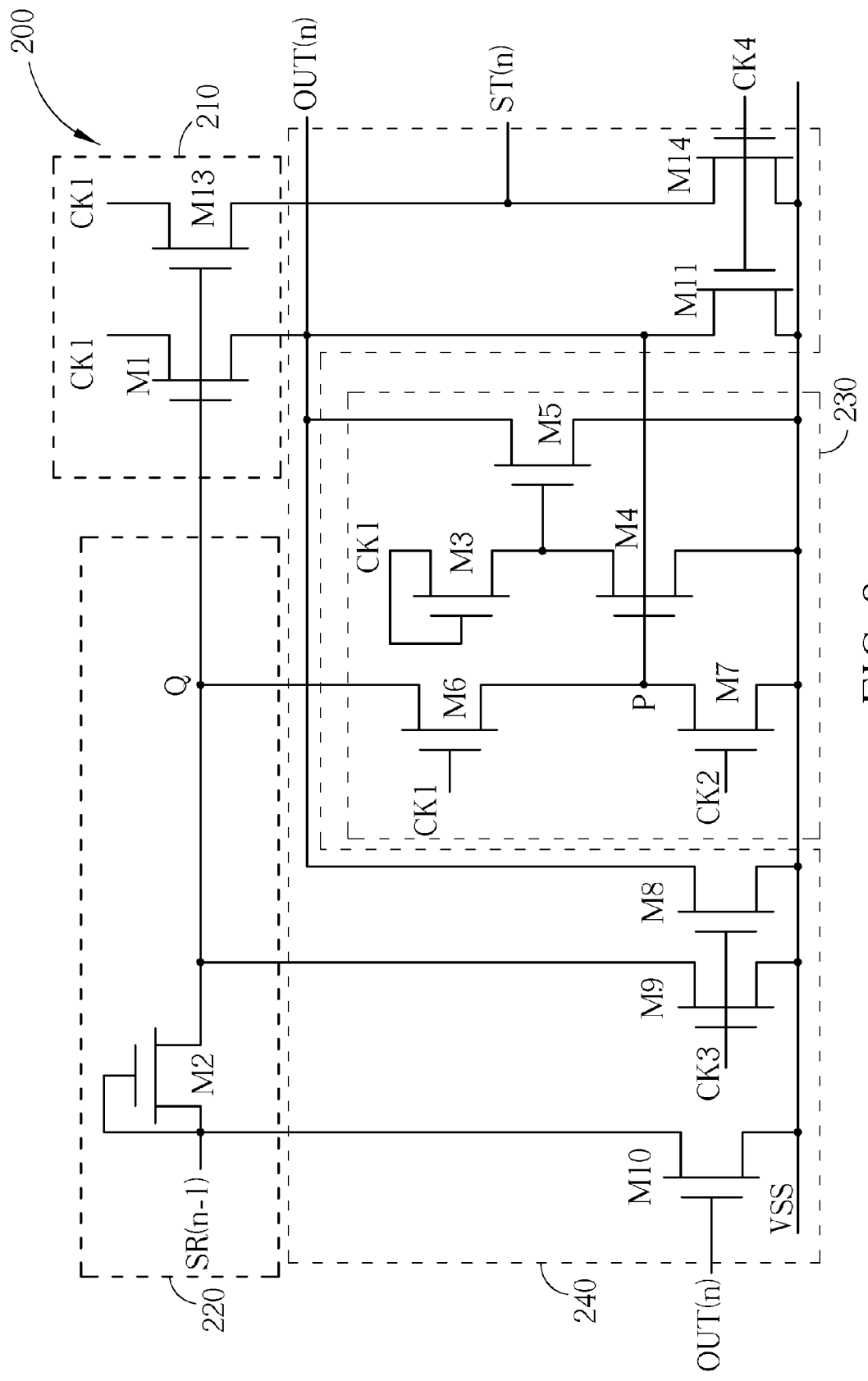
FIG. 2 is diagram illustrating the first embodiment of the shift register of the present invention.

Please refer to FIG. 2. FIG. 2 is diagram illustrating the first embodiment of the shift register of the present invention. The shift register comprises a plurality of electrically connected shift units 200. Each shift unit 200 comprises a pull-up circuit 210, a pull-up driving circuit 220, a pull-down driving circuit 230 and a pull-down circuit 240. The pull-up circuit 210 comprises a first transistor M1 and a thirteenth transistor M13. The pull-up driving circuit 220 comprises a second transistor M2. The pull-down driving circuit 230 comprises a third transistor M3, a fourth transistor M4, a fifth transistor M5, a sixth transistor M6 and a seventh transistor M7. The pull-down circuit 240 comprises a eighth transistor M8, a ninth transistor M9, a tenth transistor M10, a eleventh transistor M11 and a fourteenth transistor M14. The pull-up circuit 210 outputs a first signal CK to the output node OUT(n) according to the voltage level of the first signal CK1 and the driving node Q. The pull-up driving circuit 220 drives the pull-up circuit 210 according to the output voltage of the previous shift unit. The pull-off driving circuit 240 outputs the low voltage level VSS to the driving node Q and the output node OUT according to the first signal CK1 and the second signal CK2. The pull-off circuit 230 resets the pull-up driving circuit 220 according to the voltage level of the node Q, as well as outputting the low voltage level VSS to the driving node Q and the output node OUT(n) according to the third signal CK3 and the fourth signal CK4.

The first end of the first transistor M1 is utilized to receive the first signal CK1, and the second end of the first transistor M1 is electrically connected to the output node OUT(n). The first end of the second transistor M2 is electrically connected to the output node OUT(n-1) of the previous shift unit, the control end of the second transistor M2 is electrically connected to the first end of the second transistor M2, and the second end of the second transistor M2 is electrically connected to the driving node Q. The first end of the third transistor M3 is utilized to receive the first signal CK1, the control end of the third transistor M3 is electrically connected to the first end of the third transistor M3, and the second end of the third transistor M3 is electrically connected to the node P. The first end of the fourth transistor M4 is electrically connected to the node P, the control end of the fourth transistor M4 is electrically connected to the output node OUT(n), and the second end of the fourth transistor M4 is utilized to receive the low voltage level VSS. The first end of the fifth transistor M5 is electrically connected to the output node OUT(n), the control end of the fifth transistor M5 is electrically connected to the node P, and the second end of the fifth transistor M5 is utilized to receive the low voltage level VSS. The first end of the sixth transistor M6 is electrically connected to the driving node Q, the control end of the sixth transistor M6 is utilized to receive a first signal CK1, and the second end of the sixth transistor M6 is electrically connected to the output node OUT(n). The first end of the seventh transistor M7 is electrically connected to the output node OUT(n), the control end of the seventh transistor M7 is utilized to receive the second signal CK2, and the second end of the seventh transistor M7 utilized to receive the low voltage level VSS. The first end of the eighth transistor M8 is electrically connected to the output node OUT(n), the control end of the eighth transistor M8 is utilized to receive the third signal CK3, and the second end of the eighth transistor M8 is utilized to receive the low voltage level VSS. The first end of the ninth transistor M9 is electrically connected to the node Q, the control end of the ninth transistor M9 is utilized to receive the third signal CK3, and the second end of the ninth transistor M9 is utilized to receive the low voltage level VSS. The first end of the tenth transistor M10 is electrically connected to the first end of the first transistor M1, the control end of the tenth transistor M10 is electrically connected to the output node OUT(n), and the second end of the tenth transistor M10 is utilized to receive the low voltage level VSS. The first end of the eleventh transistor M11 is electrically connected to the output node OUT(n), the control end of the eleventh transistor M11 is utilized to receive the fourth signal CK4, and the second end of the eleventh transistor M11 is utilized to receive the low voltage level VSS. The first end of the thirteenth transistor M13 is utilized to receive the first signal CK1, the control end of the thirteenth transistor M13 is electrically connected to the driving node Q, and the second end of the thirteenth transistor M13 is electrically connected to the transmitting node ST(n). The first end of the fourteenth transistor M14 is electrically connected to the transmitting node ST(n), the control end of the fourteenth transistor M14 is utilized to receive the fourth signal CK4, and the second end of the fourteenth transistor M14 is utilized to receive the low voltage level VSS. In the embodiment of the present invention, the voltage level of the transmitting node ST(n) is equal to that of the output node OUT(n), but utilizing the transmitting node ST(n) enhances the driving ability to the next stage of the shift register.

Figure 3:
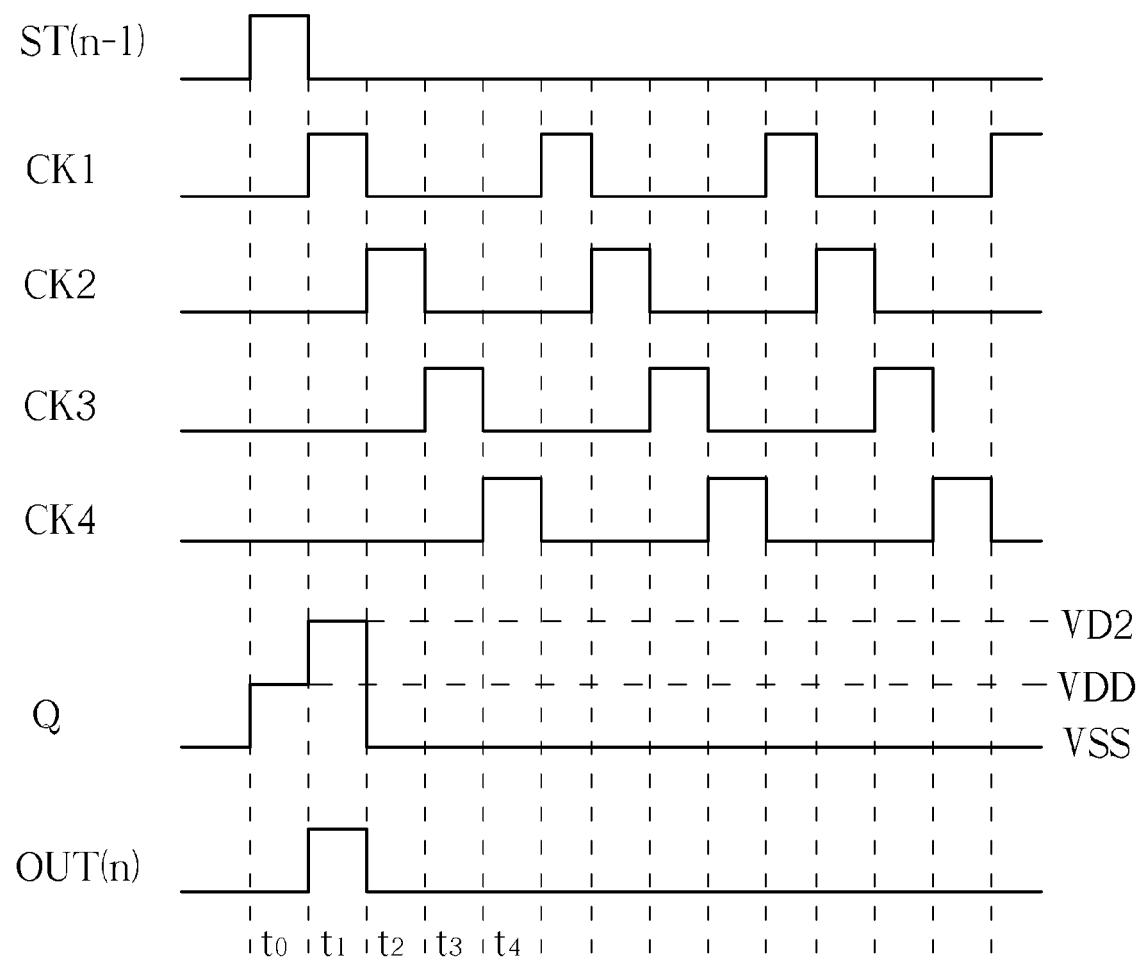
FIG. 3 is a waveform diagram illustrating the signals of the shift register in FIG. 2.

Please refer to FIG. 3. FIG. 3 is a waveform diagram illustrating the signals of the shift register in FIG. 2. For the duration t0, the transmitting node ST(n-1) of the (n-1)th shift unit is of the high voltage level VDD, so the second transistor M2 is turned on for transmitting the high voltage VDD to the transmitting node Q. The high voltage level VDD of the driving node Q turns on the first transistor M1; for the duration t1, the voltage level of the first signal CK1 is of the high voltage level VDD and due to the coupling effect of the parasitic capacitor between the first end and the control end of the first transistor M1, the voltage level of the driving node Q is increased to a second high voltage level VD2, consequently the turn-on resistance of the first transistor M1 is lowered, so the high voltage level VDD requires less time (i.e. faster) to be transmitted to the output node OUT(n). In the present invention, by utilizing the voltage level of the output node OUT(n) to self-reset, when the output node OUT(n) is of the high voltage level VDD, the tenth transistor M10 is turned on so the control end of the second transistor M2 is turned off from receiving the low voltage level VSS. When the first signal CK1 is of the high voltage level VDD, the third transistor M3 and the sixth transistor M6 are turned on, so the high voltage level VDD of the first signal CK1 is transmitted to the node P via the third transistor M3. On the other hand, the second high voltage level VD2 of the driving node Q is transmitted to the control end of the fourth transistor M4 via the sixth transistor M6 for turning on the fourth transistor M4, so the low voltage level VSS is transmitted to the node P via the fourth transistor M4. For the duration t2, the second signal CK2 is of the high voltage level VDD, the seventh transistor M7 is turned on for transmitting the low voltage level VSS to the control end of the fourth transistor M4 and the output node OUT(n). At this moment the first signal CK1 is of the low voltage level VSS, but the driving node Q is of the high voltage level for turning on the first transistor M1, so the low voltage level VSS is transmitted accordingly to the output node OUT(n) via first transistor M1. For the duration t3, the third signal CK3 is of the high voltage level VDD, the eighth transistor M8 and the ninth transistor M9 are turned on, for transmitting the low voltage level to the output node OUT(n) and the driving node Q respectively. For the duration t4, the fourth signal CK4 is of the high voltage level VDD, the eleventh transistor M11 and the fourteenth transistor M14 are turned on, for transmitting the low voltage level to the output node OUT(n) and the transmitting node ST(n) respectively.

Figure 4:
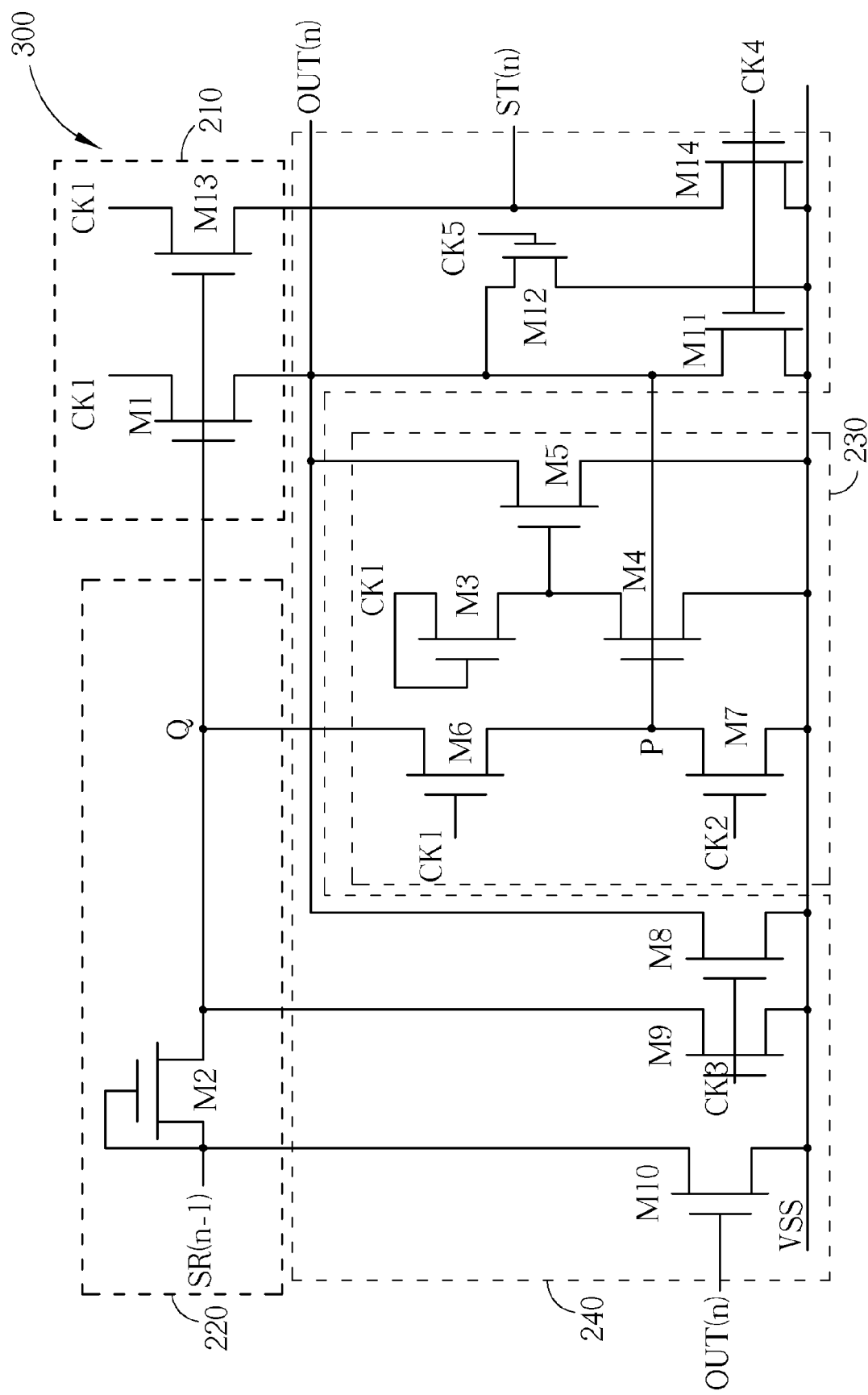
FIG. 4 is a diagram illustrating the second embodiment of the shift register of the present invention.
Figure 5:
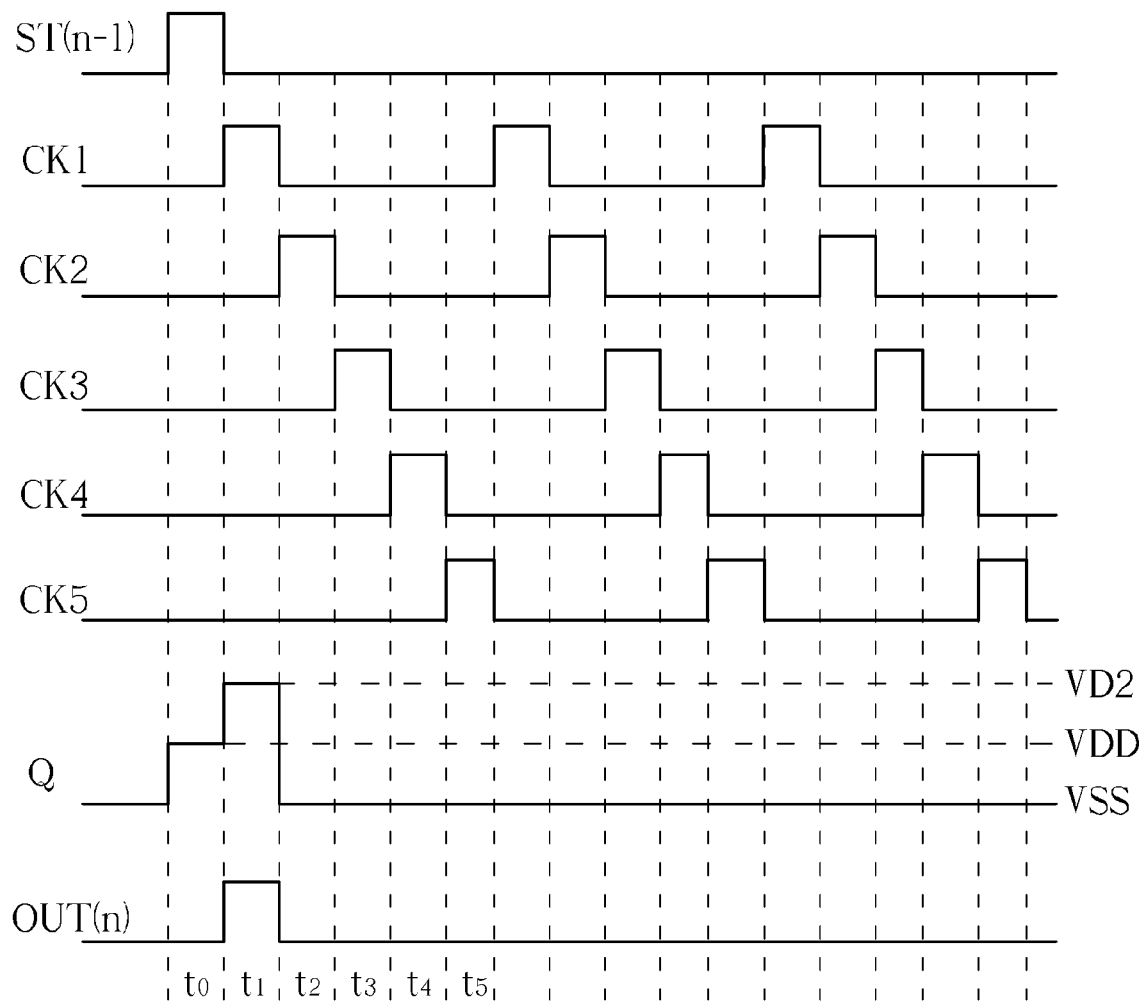
FIG. 5 is the waveform diagram illustrating the signals of the shift register in FIG. 4.

Please refer to FIG. 4 and FIG. 5. FIG. 4 is a diagram illustrating the second embodiment of the shift register of the present invention. FIG. 5 is the waveform diagram illustrating the signals of the shift register in FIG. 4. In the second embodiment of the present invention as illustrated in FIG. 4, the shift unit 300 of the shift register further comprises a twelfth transistor M12. The first end of the twelfth transistor M12 is electrically connected to the output node OUT(n), the control end of the twelfth transistor M12 is utilized to receive the fifth signal CK5, and the second end of the twelfth transistor M12 is utilized to receive the low voltage level VSS. The twelfth transistor M12 is controlled by the fifth signal CK5, for enhancing the ability of pulling the voltage level of the output node OUT(n) to the low voltage level VSS. As illustrated in FIG. 5, the first to fifth signals CK1~CK5 are sequential pulse signals. In the second embodiment, the operation of the shift register is similar to that of the first embodiment for the durations t0~t4. For the duration t5, the fifth signal CK5 is of the high voltage level VDD, the twelfth transistor M12 is turned on, for transmitting the low voltage level VSS to the output node OUT(n).

In conclusion, at least four sets of signals CK1~CK4 are utilized to control the shift register of the present invention, the ability of pulling the voltage level of the output node OUT(n) to the low voltage level can be effectively enhanced. The transistors of the shift register are controlled by the signals CK1~CK4, so the circuit operation is less influenced by the signals due to abnormal voltage coupling. The power consumption of the shift register can be lowered since the operation frequencies of the signals CK1~CK4 are relatively low. Also, the shift unit of the shift register utilizes the voltage level of the output node OUT(n) to self-reset, so the additional signal line electrically connected to the previous shift unit is not required, and the layout size of the overall circuit can be reduced.

Those skilled in the art will readily observe that numerous modifications and alterations of the device and method may be made while retaining the teachings of the invention.

What is claimed is:

1. A shift register, comprising a plurality of electrically connected shift units, wherein each shift unit comprises:
   a pull-up circuit, for outputting a first signal to an output node according to the first signal and a voltage level of a driving node;
   a pull-up driving circuit, electrically connected to the pull-up circuit, for driving the pull-up circuit according to an output voltage of the previous shift unit;
   a pull-down driving circuit, electrically connected to the pull-up driving circuit, for outputting a low voltage level to the driving node and the output node, according to the first signal and a second signal, comprising:
      a first transistor, comprising a first end for receiving the first signal, a control end electrically connected to the first end, and a second end electrically connected to a first node;
      a second transistor, comprising a first end electrically connected to the first node, a control end electrically connected to the output node and a second end for receiving the low voltage level;
      a third transistor, comprising a first end electrically connected to the output node, a control end electrically connected to the first node, and a second end for receiving the low voltage level;
      a fourth transistor, comprising a first end electrically connected to the driving node, a control end for receiving the first signal, and a second end electrically connected to the output node; and
      a fifth transistor, comprising a first end electrically connected to the output node, a control end for receiving the second signal, and a second end for receiving the low voltage level; and
   a pull-down circuit, electrically connected to the pull-up circuit and the pull-up driving circuit, for resetting the pull-up driving circuit according to the voltage level of the output node, and outputting the low voltage level to the driving node and the output node according to a third signal and a fourth signal.

2. The shift register of claim 1, wherein the pull-up circuit comprises:
   a sixth transistor, comprising a first end for receiving the first signal, a control end electrically connected to the driving node, and a second end electrically connected to the output node.

3. The shift register of claim 2, wherein the pull-up driving circuit comprises:
   a seventh transistor, comprising a first end electrically connected to the output node of the previous shift unit for receiving the output voltage, a control end electrically connected to the first end, and a second end electrically connected to the driving node.

4. The shift register of claim 3, wherein the pull-down circuit comprises:
   an eighth transistor, comprising a first end electrically connected to the output node, a control end for receiving the third signal, and a second end for receiving the low voltage level;
   a ninth transistor, comprising a first end electrically connected to the driving node, a control end for receiving the third signal, and a second end for receiving the low voltage level;
   a tenth transistor, comprising a first end electrically connected to the first end of the seventh transistor, a control end electrically connected to the output node, and a second end for receiving the low voltage level; and
   a eleventh transistor, comprising a first end electrically connected to the output node, a control end for receiving the fourth signal, and a second end for receiving the low voltage level.

5. The shift register of claim 4, wherein the first signal, the second signal, the third signal and the fourth signal are sequential pulse signals.

6. The shift register of claim 4, wherein the pull-down circuit further comprises:
   a twelfth transistor, comprising a first end electrically connected to the output node, a control end for receiving a fifth signal, and a second end for receiving the low voltage level.

7. The shift register of claim 6, wherein the first signal, the second signal, the third signal, the fourth signal and the fifth signal are sequential pulse signals.

8. The shift register of claim 1, wherein the pull-up circuit comprises:
   a sixth transistor, comprising a first end for receiving the first signal, a control end electrically connected to the driving node, and a second end electrically connected to the output node; and a seventh transistor, comprising a first end for receiving the first signal, a control end electrically connected to the driving node, and a second end electrically connected to a transmitting node.

9. The shift register of claim 3, wherein the pull-down circuit comprises:
an eighth transistor, comprising a first end electrically connected to the output node, a control end for receiving the third signal, and a second end for receiving the low voltage level;
a ninth transistor, comprising a first end electrically connected to the driving node, a control end for receiving the third signal, and a second end for receiving the low voltage level;
a tenth transistor, comprising a first end electrically connected to the first end of the seventh transistor, a control end electrically connected to the output node, and a second end for receiving the low voltage level;
an eleventh transistor, comprising a first end electrically connected to the output node, a control end for receiving the fourth signal, and a second end for receiving the low voltage level;
a twelfth transistor, comprising a first end electrically connected to the transmitting node, a control end for receiving the fourth signal, and a second end for receiving the low voltage level.

10. The shift register of claim 9, wherein the first signal, the second signal, the third signal and the fourth signal are sequential pulse signals.

11. The shift register of claim 9, wherein the pull-down circuit further comprises:
a thirteenth transistor, comprising a first end electrically connected to the output node, a control end for receiving a fifth signal, and a second end for receiving the low voltage level.

12. The shift register of claim 11, wherein the first signal, the second signal, the third signal, the fourth signal and the fifth signal are sequential pulse signals.

13. A shift register, comprising a plurality of electrically connected shift units, wherein each shift unit comprises:
a pull-up circuit, for outputting a first signal to an output node according to the first signal and a voltage level of a driving node;
a pull-up driving circuit, comprising a first transistor electrically connected to the pull-up circuit, for driving the pull-up circuit according to an output voltage of the previous shift unit;
a pull-down driving circuit, electrically connected to the pull-up driving circuit, for outputting a low voltage level to the driving node and the output node, according to the first signal and a second signal, comprising:
a second transistor, comprising a first end electrically connected to the driving node, a control end for receiving the first signal, and a second end electrically connected to the output node; and
a third transistor, comprising a first end electrically connected to the output node, a control end for receiving the second signal, and a second end for receiving the low voltage level; and
a pull-down circuit, electrically connected to the pull-up circuit and the pull-up driving circuit, for resetting the pull-up driving circuit according to the voltage level of the output node, and outputting the low voltage level to the driving node and the output node according to a third signal and a fourth signal, comprising:
a fourth transistor, comprising a first end electrically connected to the driving node, a control end for receiving the third signal, and a second end for receiving the low voltage level; and
a fifth transistor, comprising a first end electrically connected to the first end of the first transistor, a control end electrically connected to the output node, and a second end for receiving the low voltage level.

14. A shift register, comprising a plurality of electrically connected shift units, wherein each shift unit comprises:
a pull-up circuit, for outputting a first signal to an output node according to the first signal and a voltage level of a driving node;
a pull-up driving circuit, comprising a first transistor electrically connected to the pull-up circuit, for driving the pull-up circuit according to an output voltage of the previous shift unit;
a pull-down driving circuit, electrically connected to the pull-up driving circuit, for outputting a low voltage level to the driving node and the output node, according to the first signal and a second signal; and
a pull-down circuit, electrically connected to the pull-up circuit and the pull-up driving circuit, for resetting the pull-up driving circuit according to the voltage level of the output node, and outputting the low voltage level to the driving node and the output node according to a third signal and a fourth signal, comprising:
a second transistor, comprising a first end electrically connected to the driving node, a control end for receiving the third signal, and a second end for receiving the low voltage level; and
a third transistor, comprising a first end electrically connected to the first end of the first transistor, a control end electrically connected to the output node, and a second end for receiving the low voltage level.

* * * * *